US010224447B2

(12) United States Patent
Kwon et al.

(10) Patent No.: US 10,224,447 B2
(45) Date of Patent: Mar. 5, 2019

(54) CONNECTOR AND SOLAR CELL MODULE COMPRISING THE SAME

(71) Applicant: LG INNOTEK CO., LTD., Seoul (KR)

(72) Inventors: Se Han Kwon, Seoul (KR); Do Won Bae, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 675 days.

(21) Appl. No.: 14/369,065

(22) PCT Filed: Dec. 21, 2012

(86) PCT No.: PCT/KR2012/011288
§ 371 (c)(1),
(2) Date: Jun. 26, 2014

(87) PCT Pub. No.: WO2013/100498
PCT Pub. Date: Jul. 4, 2013

(65) Prior Publication Data
US 2014/0352754 A1   Dec. 4, 2014

(30) Foreign Application Priority Data
Dec. 26, 2011 (KR) .................. 10-2011-0142894

(51) Int. Cl.
*H01L 31/05* (2014.01)
*H01R 13/24* (2006.01)
(Continued)

(52) U.S. Cl.
CPC .......... *H01L 31/0508* (2013.01); *H01L 31/05* (2013.01); *H01R 13/2421* (2013.01);
(Continued)

(58) Field of Classification Search
CPC .............. H02S 40/36; H01L 31/02008; H01L 31/0508; H01L 31/05; H01R 31/06; H01R 13/2421
(Continued)

(56) References Cited

U.S. PATENT DOCUMENTS 2,796,591 A * 6/1957 Carter ................ H01R 27/00
439/172
9,231,123 B1 * 1/2016 Sherman .......... H01L 31/02002
(Continued)

FOREIGN PATENT DOCUMENTS

CN        1581516 A    2/2005
CN       201813030 U   4/2011
(Continued)

OTHER PUBLICATIONS

Chinese Office Action dated Nov. 27, 2015 in Chinese Application No. 201280070656.X.
(Continued)

*Primary Examiner* — Allison Bourke
(74) *Attorney, Agent, or Firm* — Saliwanchik, Lloyd & Eisenschenk

(57) ABSTRACT

Disclosed are a connector and a solar cell module including the same. The connector includes a body, and a connecting part received in the body. The connecting part is movably provided at an inside of the body and an outside of the body. The solar cell module includes a plurality of solar cell modules, a cable to connect the solar cell modules to each other, and a connector at an end portion of the cable. The connector includes a body, and a connecting part received in the body. The connecting part is movably provided at an inside of the body and an outside of the body. The solar cell module includes a first solar cell module including a first cable and a first connector, and a second solar cell module
(Continued)

including a second cable and a second connector. The first connector includes a first body, a first connecting part received in the first body, a first fixing part, and a first-first groove and a first-second groove provided in the first connecting part. The second connector includes a second body, a second connecting part received in the second body, a second fixing part, and a second-first groove and a second-second groove provided in the second connecting part. The first connecting part is placed at an inside of the first body and an inside of the second body, such that the first connector is connected with the second connector.

6 Claims, 1 Drawing Sheet

(51) Int. Cl.
  *H01R 31/06* (2006.01)
  *H02S 40/36* (2014.01)
  *H01R 13/621* (2006.01)
  *H01R 101/00* (2006.01)

(52) U.S. Cl.
  CPC ............ *H01R 31/06* (2013.01); *H02S 40/36* (2014.12); *H01R 13/6215* (2013.01); *H01R 2101/00* (2013.01); *Y02E 10/50* (2013.01)

(58) Field of Classification Search
  USPC ........................................................ 136/244
  See application file for complete search history.

(56) References Cited

U.S. PATENT DOCUMENTS

| | | |
|---|---|---|
| 2005/0022859 A1 | 2/2005 | Nass et al. |
| 2008/0271774 A1* | 11/2008 | Kalkanoglu ...... H01L 31/02008 |
| | | 136/244 |
| 2011/0183540 A1* | 7/2011 | Keenihan ............... H01R 31/00 |
| | | 439/345 |

FOREIGN PATENT DOCUMENTS

| | | |
|---|---|---|
| EP | 0838878 A1 | 4/1998 |
| EP | 0838878 B1 | 2/1999 |
| KR | 10-1998-0070997 | 10/1998 |
| KR | 10-2011-0065018 | 6/2011 |

OTHER PUBLICATIONS

International Search Report in International Application No. PCT/KR2012/011288, filed Dec. 21, 2012.

* cited by examiner

CONNECTOR AND SOLAR CELL MODULE COMPRISING THE SAME

CROSS-REFERENCE TO RELATED APPLICATION

This application is the U.S. national stage application of International Patent Application No. PCT/KR2012/011288, filed Dec. 21, 2012, which claims priority to Korean Application No. 10-2011-0142894, filed Dec. 26, 2011, the disclosures of each of which are incorporated herein by reference in their entirety.

TECHNICAL FIELD

The disclosure relates to a connector and a solar cell module including the same.

BACKGROUND ART

A solar cell module to convert light energy into electrical energy through photoelectric conversion effect has been extensively used as a device to obtain non-pollution energy contributing to the conservation of global environment.

As the photoelectric conversion effect of a solar cell is improved, a great number of solar cell systems having a solar cell module are installed even for home use.

In order to output power generated from the solar cell module including solar cells that generate power from the light of the sun to the outside, conductors acting as positive and negative electrodes are provided in the solar cell module, and terminals of the conductors, which serve as connectors connected to a cable of outputting current to the outside, are withdrawn out of a photovoltaic module.

Building-Integrated Photovoltaic System (BIPV) modules, which are used in replace of transparent glass in buildings, are equipped with cables to connect solar cell modules to each other. The solar cell modules have female and male connectors according to positive and negative electrodes for the connection with the cables. However, in the solar cell modules, the matching relationship between the female and male connectors and the positive and negative electrodes may be varied according to manufactures. In addition, when arrays, in which a plurality of solar cell modules are integrated, are connected to each other, the connection between female-female connectors and male-male connectors may cause problems.

DISCLOSURE OF INVENTION

Technical Problem

The embodiment provides a connector having improved reliability and a solar cell module.

Solution to Problem

According to the embodiment, there is provided a connector for a solar cell module which includes a body and a connecting part received in the body. The connecting part is movably provided at an inside of the body and an outside of the body.

According to the embodiment, the solar cell module includes a plurality of solar cell modules, a cable to connect the solar cell modules to each other, and a connector at an end portion of the cable. The connector includes a body, and a connecting part received in the body. The connecting part is movably provided at an inside of the body and an outside of the body.

According to another embodiment, there is provided a solar cell module including a first solar cell module including a first cable and a first connector, and a second solar cell module including a second cable and a second connector. The first connector includes a first body, a first connecting part received in the first body, a first fixing part, and a first-first groove and a first-second groove provided in the first connecting part. The second connector includes a second body, a second connecting part received in the second body, a second fixing part, and a second-first groove and a second-second groove provided in the second connecting part. The first connecting part is placed at an inside of the first body and an inside of the second body, such that the first connector is connected with the second connector.

Advantageous Effects of Invention

The solar cell module according to the embodiment includes the connectors. The connector includes the bodies and the connecting parts received in the body, and the connecting parts are movably provided at the inside and the outside of the body. Connectors separately classified in the female and male shapes are not required through the first and second connectors. In other words, since each of the connectors is convertible to a female form or a male form, the connectors are applicable to products provided at both end portions of the solar cell module array. In other words, even if the products provided at both end portions of the solar cell module may have the same electrodes such as positive electrode-positive electrode, or negative electrode-negative electrode, the products may be easily connected to each other without an additional process.

According to the related art, in order to connect the products provided at both end portions of the solar cell module to each other, an additional process of cutting the end portions of a cable and re-linking the end portions of the cable with each other is required. In contrast, the embodiment can represent improved fine view and reliability without requiring the above manual finish work of the related art.

MODE FOR THE INVENTION

Figure 1:
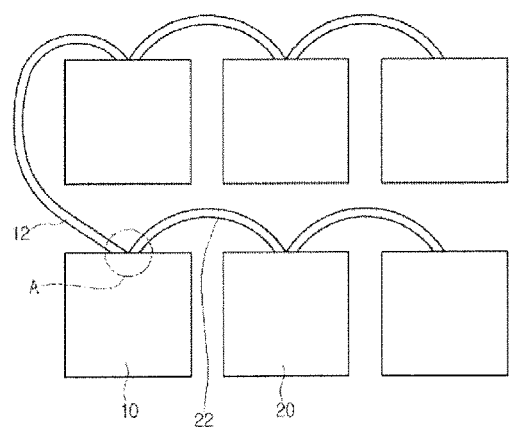
FIG. 1 is a view showing the array of a solar cell module according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer (or film), each region, each pattern, or each structure shown in the drawings may be exaggerated, omitted or schematically drawn for the convenience or clarity of explanation. In addition, the size of the layer (or film), the region, the pattern, or the structure does not utterly reflect an actual size.

Hereinafter, the embodiment will be described with reference to accompanying drawings in detail.

Hereinafter, a connector according to the embodiment and a solar cell module including the same will be described with reference to FIGS. 1 to 3. FIG. 1 is a view showing the array of a solar cell module according to the embodiment, FIG. 2 is an exploded perspective view showing the solar cell module according to the embodiment, and FIG. 3 is an enlarged view of a part A of FIG. 1.

Figure 2:
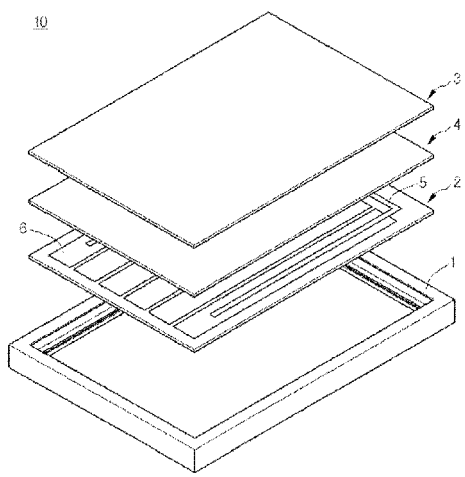
FIG. 2 is an exploded perspective view showing the solar cell module according to the embodiment.
Figure 3:
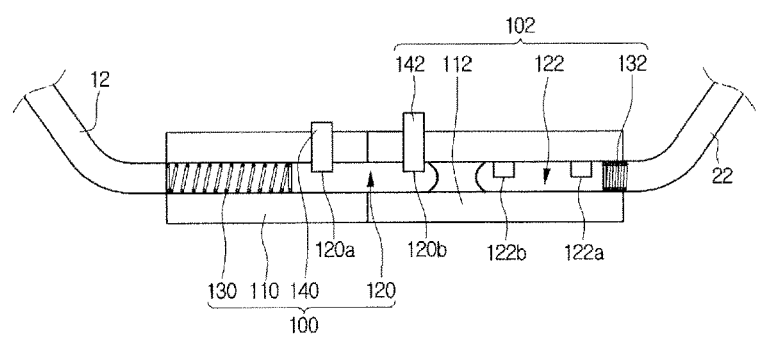
FIG. 3 is an enlarged view of a part A of FIG. 1.

Referring to FIGS. 1 to 3, the solar cell module according to the embodiment includes a plurality of solar cell modules 10 and 20, cables 12 and 22, and connectors 100 and 102.

The solar cell module 10 includes a frame 1, a solar cell panel 2, a protective substrate 3, and a buffer sheet 4.

The frame 1 is provided outside the solar cell panel 2. The frame 1 receives the solar cell panel 2, the protective substrate 3, and the buffer sheet 4. In more detail, the frame 1 may surround the lateral sides of the solar cell panels 2.

For example, the frame 1 may be a metal frame 1. In addition, the frame 1 may include aluminum (Al), stainless steel, iron, or resin.

The solar cell panel 2 is disposed inside the frame 1. The solar cell panel 2 has a plate shape and includes a plurality of solar cells 6.

For example, the solar cells 6 may include a CIGS-based solar cell, a silicon-based solar cell, a dye-sensitized solar cell, a group II-VI compound semiconductor solar cell, or a group III-V compound semiconductor solar cell.

In addition, the solar cells 6 may be disposed on a transparent substrate such as a glass substrate.

The solar cells 6 may be arranged in the shape of a stripe. In addition, the solar cells 6 may be arranged in various shapes such as a matrix shape.

The bus bar 5 is disposed on the solar cell panel 2. The bus bar 5 makes contact with the top surfaces of two solar cells 6, and is electrically connected with the solar cells 6.

For example, the bus bar 5 includes a first bus bar and a second bus bar.

The first bus bar makes contact with a top surface of one outermost solar cell of the solar cells 6. The second bus bar makes direct contact with the top surface of an opposite outermost solar cells 6.

The bus bar 5 may include a conductor, and for example, the material constituting the bus bar 5 may include copper (Cu).

The protective substrate 3 is disposed over the solar cell panel 2. The protective substrate 3 is provided in opposition to the solar cell panel 2.

The protective substrate 3 may be transparent with a high strength. The material constituting the protective substrate 3 may include tempered glass.

The buffer sheet 4 is interposed between the protective substrate 3 and the solar cell panel 200. The buffer sheet 4 protects the solar cell panel 2 from the external physical shock. In addition, the buffer sheet 4 prevents the protective substrate 3 from colliding with the solar cell panel 2.

The buffer sheet 4 may perform an anti-reflective function so that a greater quantity of light is incident onto the solar cell panel 2.

The material constituting the buffer sheet 4 may include ethylene vinyl acetate (EVA) resin.

The protective substrate 3 and the buffer sheet 4 are disposed inside the frame 1. In detail, the lateral sides of the solar cell panel 2, the protective substrate 3 and the buffer sheet 4 are inserted into and fixed to the frame 1.

The cables 12 and 22 are electrically connected with the solar cell panel 2 through the connection member (not shown) and the bus bar 5. In other words, the cables 12 and 22 transmit electrical energy generated from the solar cell panel 2 to a rectifier and/or a battery.

In addition, the cables 12 and 22 may connect adjacent solar cell modules to each other. In other words, the solar cell modules may be connected to each other through the cables 12 and 22.

The connection member connects the bus bar 5 with the cables 12 and 22. In other words, the bus bar 5 is connected to one end of the connection member, and the cables 12 and 22 are connected to an opposite end of the connection member. The connection member may include a conductor and an insulator, and may include a bypass diode.

The bus bar 5 and the cables 12 and 22 may be connected to the connection member by using solder paste.

A plurality of solar cell modules having the above characteristics may be provided.

The connectors 100 and 102 may be positioned at end portions of the cables 12 and 22. The connectors 100 and 102 may include bodies 110 and 112, connecting parts 120 and 122, moving parts 130 and 132, and fixing parts 140 and 142.

The bodies 110 and 112 may receive the connecting parts 120 and 122, the moving parts 130 and 132, and the fixing parts 140 and 142.

The connecting parts 120 and 122 may be received in the bodies 110 and 112. The connecting parts 120 and 122 may be movably provided at the inside and the outside of the bodies 110 and 112. In other words, the connecting parts 120 and 122 may be received in the bodies 110 and 112. Portions of the connecting parts 120 and 122 may be moved to the outside of the bodies 110 and 112. The connecting parts 120 and 122 may be movably provided on the same plane.

The connecting parts 120 and 122 include grooves 120a, 120b, 122a, and 122b. Each of the connecting parts 120 and 122 includes at least one of the grooves 120a, 120b, 122a, and 122b may be provided. Referring to FIG. 3, each of the connecting parts 120 and 122 may include two grooves 120a 120b, 122a, and 122b. When the connecting parts 120 and 122 are moved to the outside of the bodies 110 and 112, the fixing parts 140 and 142 are placed in the grooves 120a 120b, 122a, and 122b to fix the connecting parts 120 and 122. Accordingly, the grooves 120a 120b, 122a, and 122b may have the shapes corresponding to the shapes of the fixing parts 140 and 142. In other words, the grooves 120a 120b, 122a, and 122b have the shape of a recess, and the fixing parts 140 and 142 have the shape of a protrusion, so that the fixing parts 140 and 142 may be fitted into the grooves 120a, 120b, 122a, and 122b.

The moving parts 130 and 132 may be connected to the connecting parts 120 and 122. The moving parts 130 and 132 move the connecting parts 120 and 122. The moving parts 130 and 132 may include springs. The moving parts 130 and 132 may be compressed or elastically deformed to move the connecting parts 120 and 122. In detail, when the spring is compressed, the connecting parts 120 and 122 may be provided in the bodies 110 and 112. In addition, when the spring is elastically deformed, portions of the connecting parts 120 and 122 may be placed to the outside of the bodies 110 and 112. In other words, the portions of the connecting parts 120 and 122 may deviate out of the bodies 110 and 112.

Electrical wires are connected to the connecting parts 120 and 122. Accordingly, current may be applied to the connecting parts 120 and 122.

Hereinafter, the structure of the solar cell modules when the solar cell modules are connected to each other through the cables 12 and 22 may be described in more detail.

The solar cell modules may include first and second solar cell modules 10 and 20.

The first solar cell module 10 includes first cables 12 and 22 and a first connector 100. The first connector 100 may include a first body 110, the first connecting part 120 received in the first body 110, the first fixing part 140, and the first-first groove 120a and the first-second groove 120b.

The second solar cell module 20 includes the cables 12 and 22 and a second connector 102. The second connector 102 may include the second body 112, the second connecting part 122 received in the second body 112, the second fixing part 142, and the first-first groove 120 a and the first-second groove 120 b placed in the second connecting part 122.

In order to connect the first solar cell module 10 to the second solar cell module 20, the first connector 100 may be connected to the second connector 102. In other words, a portion of the first connecting part 120 may be exposed out of the first body 110. The exposed first connecting part 120 is fitted into the second body 112, thereby connecting the first connector 100 with the second connector 102. In other words, the first connecting part 120 may be placed inside the first body 110 and the second body 112.

In detail, the second fixing part 142 may be placed in the first-second groove 120b of the first connecting part 120, so that the first connecting part 120 may be stably placed inside the second body 112. In addition, the first fixing part 140 is placed in the groove 120a of the first connecting part 120, so that the first connecting part 120 can be more securely connected. In this case, the spring of the first moving part 130 moving the first connecting part 120 may be elastically deformed. In addition, to place the second connecting part 122 in the second body 112, the spring of the second moving part 132 may be in the compressed state.

Connectors separately classified in the female and male shapes are not required through the first and second connectors 100 and 102. In other words, since the connectors 100 and 102 is convertible to the female form or the male form, the connectors 100 and 102 are applicable to products provided at both end portions of the solar cell module array. In other words, even if the products provided at both end portions of the solar cell module may have the same electrodes such as positive electrode-positive electrode, or negative electrode-negative electrode, the products may be easily connected to each other without an additional process.

According to the related art, in order to connect the products provided at both end portions of the solar cell module to each other, an additional process of cutting the end portions of a cable and re-linking the end portions of the cable with each other is required. In contrast, the embodiment can represent improved fine view and reliability without requiring the manual finish work.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell module comprising:
a first solar cell including a first bus bar;
a second solar cell including a second bus bar and adjacent to the first solar cell;
a first cable connecting the first bus bar;
a first connector positioned at an end portion of the first cable;
a second cable connecting the second bus bar; and
a second connector positioned at an end portion of the second cable and facing the first connector,
wherein the first connector includes a first body, a first connecting part received in the first body, a first fixing part received in the first body, and a first moving part received in the first body;
wherein the second connector includes a second body, a second connecting part received in the second body, a second fixing part received in the second body, and a second moving part received in the second body;
wherein the first moving part includes a first spring and moves the first connecting part,
wherein the second moving part includes a second spring and moves the second connecting part,
wherein when potential energy of the first and second springs is zero, the first and second springs each moves the corresponding connecting part to be outside the corresponding body;
wherein the first connecting part is movably provided at an inside of the first body and an outside of the first body by the first moving part,
wherein the second connecting part is movably provided at an inside of the second body and an outside of the second body by the second moving part,
wherein the first and second fixing parts each has a shape of a protrusion to fix the first connecting part and the second connecting part, respectively;
wherein the first connecting part includes a first-first groove and a first-second groove and shapes of the first-first groove and the first-second groove correspond to the shapes of the first and second fixing parts, respectively;
wherein the second connecting part includes a second-first groove and a second-second groove and shapes of the second-first groove and the second-second groove correspond to the shapes of the first and second fixing parts, respectively;
wherein a distance between the first-first groove and the first-second groove corresponds to a distance between the first fixing part and the second fixing part,
wherein a distance between the second-first groove and the second-second groove corresponds to the distance between the first fixing part and the second fixing part, and
wherein, when a portion of the first connecting part is exposed out of the first body and inserted into the second body, the second connecting part is placed inside the second body, and each of the first and second fixing parts is fitted into each of the first-first and first-second grooves, respectively, and the first and second fixing parts are spaced apart from the second-first and second-second grooves, respectively.

2. The solar cell module of claim 1, wherein the first moving part is connected to the first connecting part and the second moving part is connected to the second connecting part.

3. The solar cell module of claim 1, wherein the first and second moving parts are movably provided on a same plane.

4. The solar cell module of claim 1, wherein, when the portion of the first connecting part is exposed out of the first body and inserted into the second body, the first spring is elastically deformed and the second spring is compressed.

5. The solar cell module of claim 1, wherein, when a portion of the second connecting part is exposed out of the second body and inserted into the first body, the first connecting part is placed inside the first body, each of the first and second fixing parts is fitted into each of the second-first and second-second grooves, respectively, and the first and second fixing parts are spaced apart from the first-first and first-second grooves, respectively.

6. The solar cell module of claim 1, wherein, when a portion of the second connecting part is exposed out of the second body and inserted into the first body, the first spring is compressed and the second spring is elastically deformed.

* * * * *